US005453711A

United States Patent [19]

Yamamoto

[11] Patent Number: 5,453,711

[45] Date of Patent: Sep. 26, 1995

[54] WEIGHTED SUMMING CIRCUIT

[75] Inventor: Makoto Yamamoto, Tokyo, Japan

[73] Assignees: Yozan Inc., Tokyo; Sharp Corporation, Osaka, both of Japan

[21] Appl. No.: 147,311

[22] Filed: Nov. 5, 1993

[30] Foreign Application Priority Data

Nov. 6, 1992 [JP] Japan .................................... 4-322818

[51] Int. Cl.$^6$ ........................................ H03K 5/22

[52] U.S. Cl. .......................... 327/355; 327/361; 327/407

[58] Field of Search .................................. 328/104, 158; 307/529, 242; 327/355, 361, 407

[56] References Cited

U.S. PATENT DOCUMENTS

| | | | |
|---|---|---|---|
| 2,287,334 | 6/1942 | White | 327/355 |
| 2,931,902 | 4/1960 | Boekhorst | 327/355 |
| 3,090,000 | 5/1963 | Bentley | 327/355 |
| 3,454,850 | 7/1969 | Miller | 327/361 |
| 4,713,742 | 12/1987 | Parsley . | |
| 4,903,226 | 2/1990 | Tsividis | 364/807 |

OTHER PUBLICATIONS

Sedra and Smith, Microelectronic Circuits, 1991, FIG. 5.10(a).

Nilsson, Electric Circuits, 1983, p. 401.

McPherson, An Introduction to Electrical Machines and Transformers, 1981, p. 257.

*Primary Examiner*—Timothy P. Callahan

*Assistant Examiner*—Jung Ho Kim

*Attorney, Agent, or Firm*—Cushman, Darby & Cushman

[57] ABSTRACT

A weighted summing circuit performing a weighted summation using small scale circuitry with a degree of accuracy and that is easily adapted to operate with various kinds of processing systems. Weighted summing circuit includes parallel inductances $L_1$, $L_2$ and $L_3$ having voltages $V_1$, $V_2$ and $V_3$ at a common output $V_{out}$.

7 Claims, 2 Drawing Sheets

WEIGHTED SUMMING CIRCUIT

FIELD OF THE INVENTION

The present invention relates to a weighted summing circuit, including a plurality of parallel connected inductances having an equilibrium voltage as a common output;

BACKGROUND OF THE INVENTION

Digital weighted summing circuit are known. However, digital weighted summing circuits are large scale circuits. Analog weighted summing circuit are also known, but such circuits have in its calculation low accuracy.

SUMMARY OF THE INVENTION

This invention solves the conventional problems and provides a weighted summing circuit that performs a weighted summation using a small scale circuit having high accuracy and that is easily available for a various kinds of calculation devices.

A weighted summing circuit according to the present invention has a summing voltage as a common output in a parallel inductance circuit.

PREFERRED EMBODIMENT OF THE PRESENT INVENTION

Hereinafter an embodiment of a weighted summing circuit according to the present invention is described with referance to the attached drawings.

Figure 1:
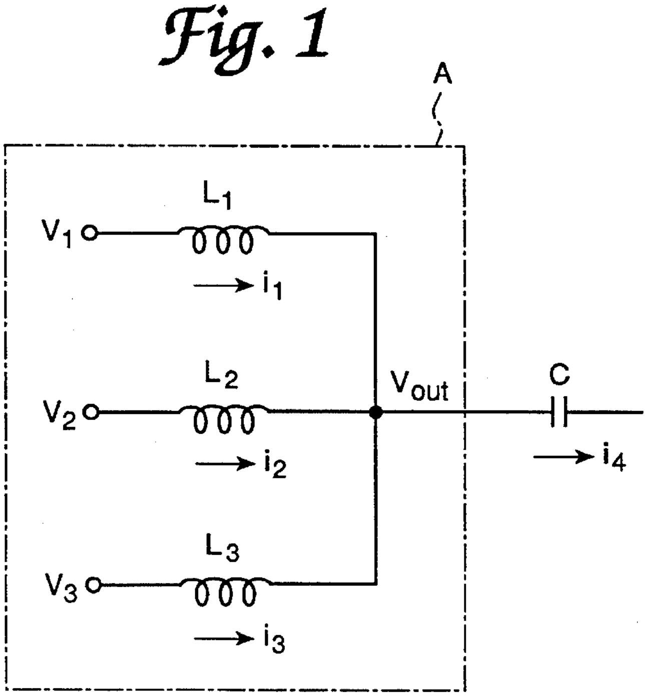
FIG. 1 is a circuit diagram showing an embodiment of a weighted summing circuit according to the present invention.

FIG. 1 shows a weighted summing circuit A that has a plural number of parallel connected inductances $L_1$, $L_2$ and $L_3$ connected to a common output. Other terminals of $L_1$, $L_2$ and L 3 are connected to input voltages $V_1$, $V_2$ and $V_3$. The output of the weighted summing circuit is connected to a circuit (Figure is omitted) through a capacitance C.

Here, currents flowing in $L_1$, $L_2$ and $L_3$ are defined as current $i_1$, $i_2$ and $i_3$. Also, change rates of each current for time t are defined as $di_1/dt$, $di_2/dt$ and $di_3/dt$. The following formulas are obtained approximately.

$$di_1/dt=(V_1-V_{out})/L_1 \quad \text{Formula 1}$$

$$di_2/dt=(V_2-V_{out})/L_2 \quad \text{Formula 2}$$

$$di_3/dt=(V_3-V_{out})/L_3 \quad \text{Formula 3}$$

If both sides of these Formulas 1 to 3 are integrated, then Formulas from 4 to 6 are obtained. Their integration constants are $I_1(O)$, $I_2(O)$ and $I_3(O)$.

$$i_1=\int_0^t \frac{V_1-V_{out}}{L_1}\,dt+I_1(0) \quad \text{Formula 4}$$

$$i_2=\int_0^t \frac{V_2-V_{out}}{L_2}\,dt+I_2(0) \quad \text{Formula 5}$$

$$i_3=\int_0^t \frac{V_3-V_{out}}{L_3}\,dt+I_3(0) \quad \text{Formula 6}$$

Formula 7 is obtained by Kirchoff's law, then Formula 8 is obtained by substituting Formulas 4, 5 and 6 for Formula 7.

$$i_1+i_2+i_3=0 \quad \text{Formula 7}$$

$$\sum_{j=1}^{3}\int_0^t \frac{V_j-V_{out}}{L_j}\,dt+I_j(0)=0 \quad \text{Formula 8}$$

Formula 8 is changed to Formula 9 through differentiating by t.

$$\sum_{j=1}^{3}\frac{V_j-V_{out}}{L_j}=0 \quad \text{Formula 9}$$

If the admittances corresponding to $L_1$ and $L_2$ and $L_3$ are defined as $a_1$, $a_2$ and $a_3$, then Formula 10 is obtained.

$$a_1=1/L_1,\ a_2=1/L_2,\ a_3=1/L_3 \quad \text{Formula 10}$$

Formula 9 can be changed into Formula 11 by expressing it in terms of $V_{OUT}$ and substituting the admittances of Formula 10

$$V_{out}=(a_1V_1+a_2V_2+a_3V_3)/(a_1+a_2+a_3) \quad \text{Formula 11}$$

This Formula is equal to a weighted sum of $V_1$, $V_2$ and $V_3$.

As an example of input signals, if $$V_1=V_{m1}\ \mathrm{Sin}\ \omega_1 t \quad \text{Formula 12}$$

$$V_2=V_{m2}\ \mathrm{Sin}\ \omega_2(t+t_1) \quad \text{Formula 13}$$

$$V_3=V_{m3}\ \mathrm{Sin}\ \omega_3(t+t_2) \quad \text{Formula 14}$$

then Formula 15 is obtained.

$$V_{out}=+\{a_1V_{m1}\ \mathrm{Sin}\ \omega_1 t+a_2V_{m2}\ \mathrm{Sin}\ \omega_2(t+t_1)+a_3V_{m3}\ \mathrm{Sin}\ \omega_3(t+t_3)\}/(a_1+a_2+a_3) \quad \text{Formula 15}$$

Figure 2A:
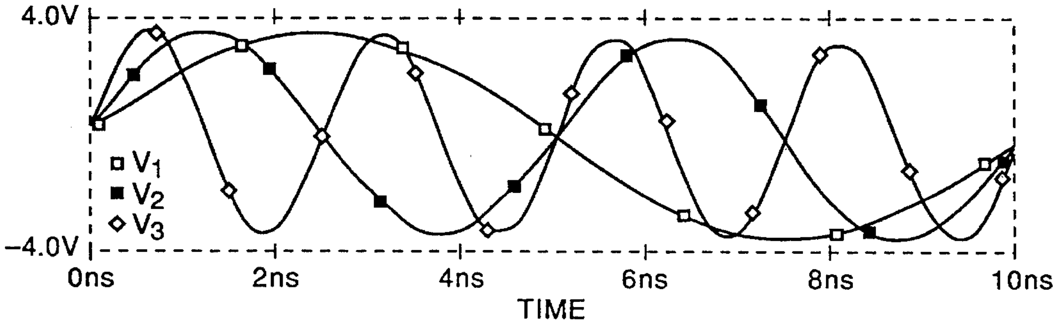
FIG. 2 is a diagram showing the relationship between changes of $V_1$, $V_2$ and $V_3$ and $V_{OUT}$.
Figure 2B:
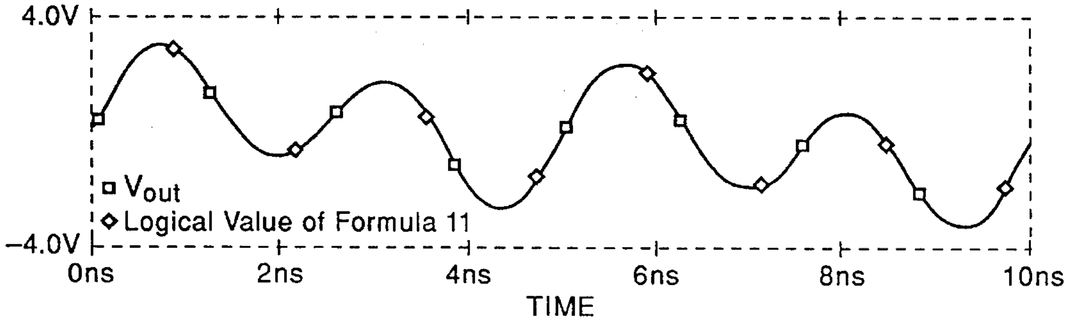
Figure 3:
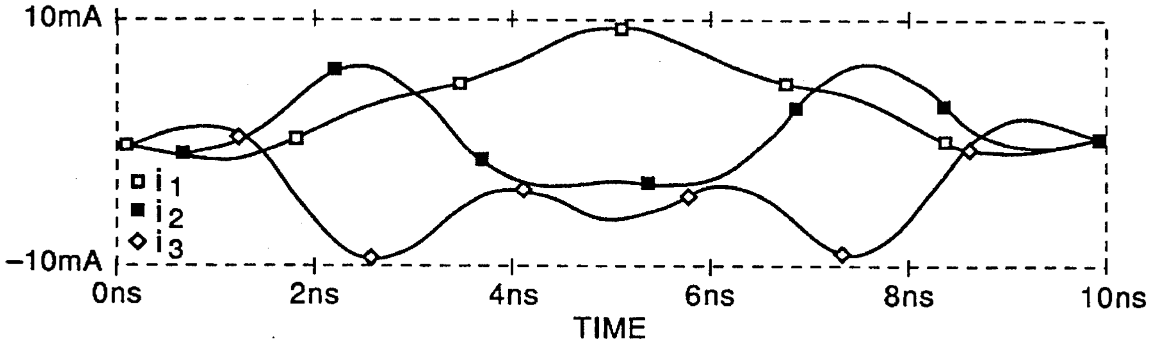
FIG. 3 is a diagram showing currents $i_1$, $i_2$ and $i_3$ corresponding to FIG. 2(*a*) and 2(*b*)

Driving the circuit in FIG. 1 by an analog simulator in a condition of L1=L2=L3 is shown by FIG. 2(*a*) and FIG. 2(*b*). As a result of this experiment, where $V_1$, $V_2$ and $V_3$ are provided as shown in FIG. 2(*b*), it was established that $V_{OUT}$ and the logical value of Formula 11 substantially coincide. In addition, $V_{OUT}$ corresponds to a weighted summation of $V_1$, $V_2$, and $V_3$. In addition, increasing the frequency reduces the consumed current.

Figure 4:
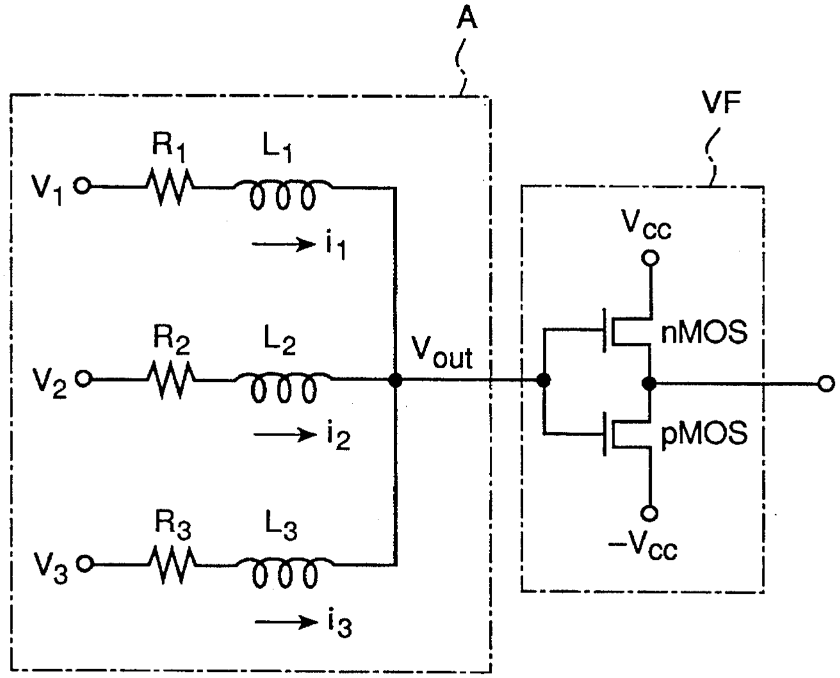
FIG. 4 is a circuit diagram showing another embodiment of the present invention.

FIG. 4 is a circuit including resistances $R_1$, $R_2$ and $R_3$ connected to each inductance $L_1$, $L_2$ and $L_3$ in series and a voltage follower circuit VF, instead of capacitance C. As a result, inductances $L_1$, $L_2$ and $L_3$ are protected from breakdown due to Joule's heat by resistances $R_1$, $R_2$ and $R_3$, and the input impedance for the voltage follower circuit VF is large. Values of these resistances $R_1$, $R_2$ and $R_3$ are relatively small and can be ignored when inductances $L_1$, $L_2$ and $L_3$ are high with increasing frequency of currents $i_1$, $i_2$ and $i_3$.

Formula 11 is converted into a general formula for an arbitrary number of inductances, and Formula 16 is obtained.

Formula 16

$$V_{out} = \sum_{i=1}^{n} a_i V_i / \sum_{i=1}^{n} a_i$$

As mentioned above, a weighted summing circuit according to the present invention has a summing voltage as a common output to a plurality of parallel connected inductances and is capable of performing a weighted summation using small scale and circuit at a high accuracy and is easily available for a various kinds of calculation devices.

What is claimed is:

1. A weighted summing circuit comprising:

i) a plurality of inductances, each of said inductances having a first terminal and a second terminal, each said second terminal being connected together;

ii) a plurality of voltage sources, wherein a separate voltage source is operatively connected to said first terminal of each inductance, each of said voltage sources producing an input voltage that varies independently of said each input voltage of others of said voltage sources and having an amplitude that is continuously variable over a range of finite slopes and over a range of voltage levels; and iii) a common output operatively connected to said second terminal of each said inductance for conducting an output of said plurality of inductances corresponding to a weighted sum of said input voltages provided by said plurality of voltage sources.

2. A weighted summing circuit as defined in claim 1, wherein said common output is operatively connected to a circuit through a capacitance.

3. A weighted summing circuit as defined in claim 1, wherein said common output is connected to a gate of a field-effect transistor.

4. A weighted summing circuit as defined in claim 1, further comprising at least one resistance connected in series with each of said inductances.

5. A method of determining a weight sum of a plurality of input voltages comprising:

providing each input voltage in said plurality of input voltages to a first terminal of each of a plurality of inductances, each of said inductances having a second terminal, connected together, each input voltage in said plurality of said input voltages varying independently of other input voltages in said plurality of input voltages, and each input voltage in said plurality of input voltages having an amplitude that is continuously variable over a range of finite slopes and over a range of voltage levels; and monitoring an output from said second terminals of said inductances, said output corresponding to a weighted sum of said input voltages of said voltage sources.

6. A method as defined in claim 5, further comprising connecting said output to a circuit through a capacitance.

7. A method as defined in claim 5, further comprising connecting said output to a gate of a field-effect transistor.

* * * * *